United States Patent

[11] 3,629,729

[72] Inventor John Hessler, Jr.
Scottsdale, Ariz.

[21] Appl. No. 49,291
[22] Filed June 24, 1970
[45] Patented Dec. 21, 1971
[73] Assignee Motorola, Inc.
Franklin Park, Ill.

[54] HIGH-FREQUENCY DOUBLY BALANCED WIDE WAVEBAND RING-CONNECTED DIODE MODULATOR

3 Claims, 2 Drawing Figs.

[52] U.S. Cl. .......... 332/16 R, 325/446, 332/43 B, 332/47, 333/11
[51] Int. Cl. .......... H01p 3/06, H04b 1/26
[50] Field of Search .......... 332/16, 16 T, 43, 43 B, 47; 325/445, 446; 331/11

[56] References Cited

UNITED STATES PATENTS 3,512,090 5/1970 Mouw .......... 325/446

*Primary Examiner*—John Kominski
*Attorney*—Mueller and Aichele

ABSTRACT: A very wide band high-frequency modulator is disclosed using ring-connected diodes in which the local oscillator and the signal frequency can be very different from each other. The modulator is doubly balanced and uses two wide band phase inverters connected across conjugate diagonals of the ring-connected diodes and a balanced to unbalanced output connection.

INVENTOR.
John Hessler Jr.
BY
Mueller & Aichele
ATTY'S.

HIGH-FREQUENCY DOUBLY BALANCED WIDE WAVEBAND RING-CONNECTED DIODE MODULATOR

BACKGROUND

This invention relates to high frequency doubly balanced wide wave band modulators using ring-connected diodes.

Modulators using ring-connected diodes are well known; however, such known modulators for the high frequency band are not doubly balanced and therefore need elements such as filter means to separate the modulation products from the input waves. Providing doubly balanced high frequency modulators which require no such separating or filtering elements in the gigahertz frequency range, for example, according to the prior art, is substantially impossible where the load oscillator frequency and the signal frequency are wide apart in frequency.

It is an object of this invention to provide an improved modulator for the ultra high frequency range using ring-connected diode elements.

It is a further object of this invention to provide a doubly balanced ultra high frequency modulator using ring-connected diode elements.

SUMMARY

In accordance with this invention, a pair of phase-inverting networks are provided which will invert the phase of the applied wave over a wide range of frequencies, up to about 6 to 1 ratio of input frequencies, for example, in the gigahertz range. The local oscillations and the signal waves are applied respectively to the phase inverters. The two outputs of one phase inverter is connected to the two opposite terminals of the four diodes connected in series to form a ring. The two outputs of the other phase inverter are connected to the other two terminals of the ring-connected diodes, and the output is taken from between the center taps on the phase inverters and applied to a single ended output connection by way of a balanced to unbalanced connector or device. Using such a modulator, no filter elements are necessary to separate the input waves from each other or from the output waves, but the separation is done by double balancing.

DESCRIPTION

Figure 1:
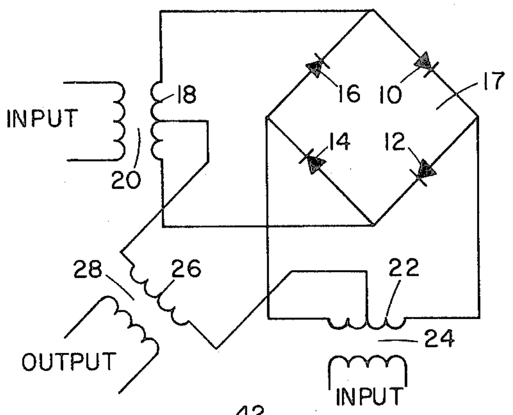
Figure 2:
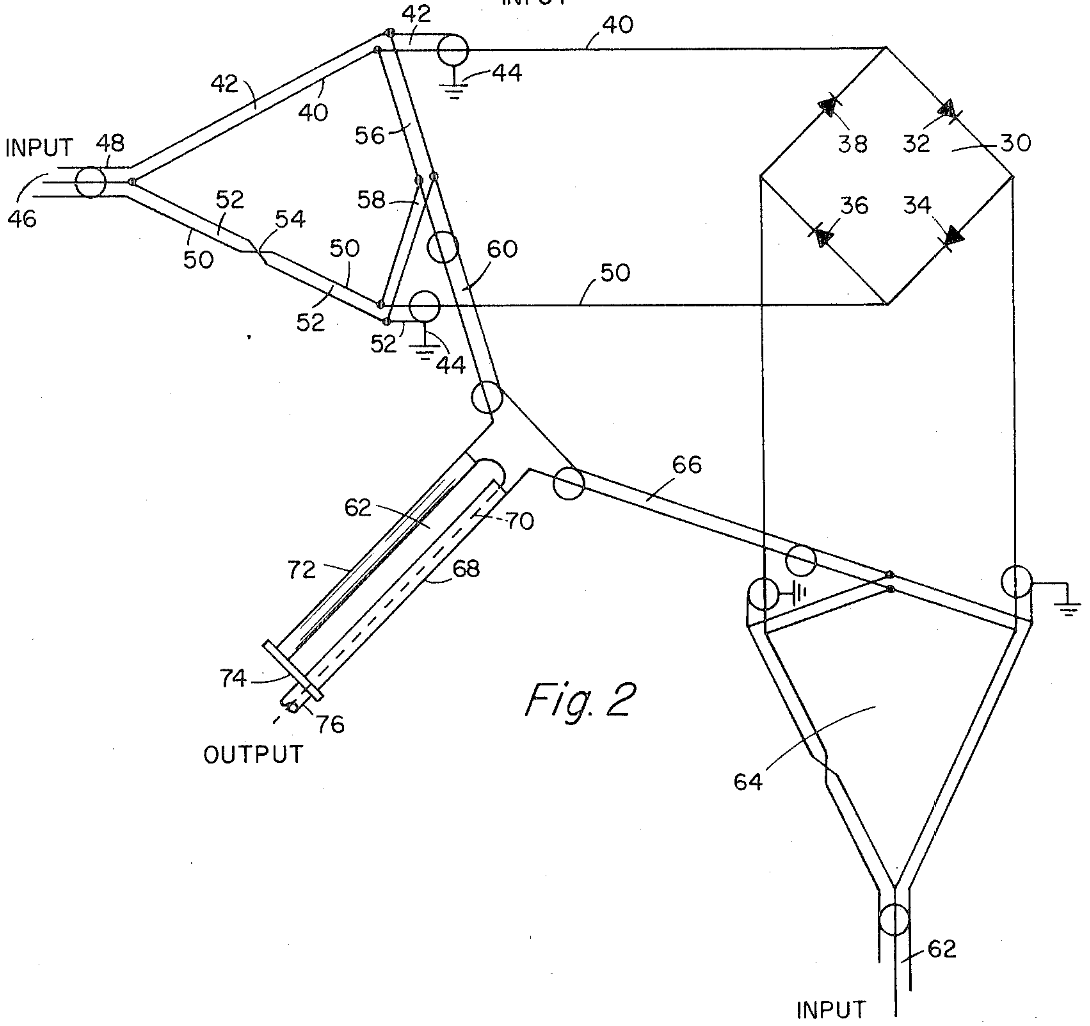

The invention will be better understood upon reading the following description in connection with the accompanying drawing in which FIG. 1 shows a low frequency doubly balanced modulator using ring-connected diodes of the prior art and FIG. 2 illustrates the high frequency doubly balanced modulator of this invention.

Turning first to FIG. 1, four diodes 10, 12, 14 and 16 are connected in a ring such that an anode of each diode is connected to one cathode of one other diode to form a bridge or ring 17. The center-tapped secondary winding 18 of a transformer 20 is connected from the anode of the diode 10 to the anode of the diode 14, whereby the secondary winding is connected across two opposite terminals of the bridge 17. A center-tapped secondary winding 22 of another transformer 24 is connected between the anodes of the diode 12 and 16 whereby the secondary winding 22 is connected across the remaining or conjugate opposite terminals of the bridge 17. The center taps of the secondary windings 18 and 22 are connected together through the primary winding 26 of an output transformer 28. If the diodes 12, 14, 16 and 18 are perfectly matched and if the center taps on the transformers secondary windings 18 and 22 are at the exact electrical center of their respective windings, the waves applied to the transformers 20 and 24 will not arrive at the other of the transformers 24 or 20, and the waves appearing at the output transformer 26 is the product of modulation of the input waves in the bridge 17 and not the separate input waves. Such matching and center tapping can be made sufficiently nearly perfect for low frequencies, whereby filter elements need not be supplied to prevent input waves from going directly to the other input or to the output transformer using the circuit of FIG. 1 for such low frequencies. This balancing is due to the fact that the transformers 20 and 24 invert the phase of the waves applied thereto over a wide frequency wave band, that is the waves applied to the opposite terminals of the bridge by each transformer's secondary winding 18 and 22 are almost exactly 180° out of phase, and, due to the exact center tapping, no input wave is applied to the primary winding 26. However, a circuit such as that of FIG. 1 cannot operate at high frequencies since transformers such as those shown in FIG. 1 will not split the phase of the applied wave at high frequencies and sufficiently accurate center tapping is not obtainable at such high frequencies.

The high frequency modulator of FIG. 2 comprises a diode bridge 30 including diodes 32, 34, 36 and 38. The anode of each diode 32, 34, 36 and 38 is connected to one only cathode of an adjacent diode to form the bridge 30. The anode of the diode 32 is connected to the center conductor 40 of a concentric line 42, whose outside conductor is grounded as by ground connection 44. The center conductor 40 of the concentric line 42 is connected to the center connection 46 of an input concentric line 48. The anode of the diode 36 is connected to the center conductor 50 of the concentric line 52. The outside conductor 52 is grounded as at 44. A transposition 54 is provided along the length of the concentric conductor 52 whereby the center conductor 50 at one side, the right side as viewed in FIG. 2 of the transposition 54 becomes the outside conductor 50 of the concentric conductor 52 at the left of the transposition 54. The outside conductor to the left of the transposition 50 is connected to the outside conductor 48 of the input concentric line 46 and the inside conductor of the concentric conductor 52 to the left of the transposition 54 is connected to the inside conductor of the input concentric line 46. A point on the concentric line 42 is connected, center conductor to center conductor, to another concentric line 56. Also, a point to the right of the transposition 54 in the concentric line 52 is connected, center conductor to center conductor, to another concentric line 56. Also, a point to the right of the transposition 54 in the concentric line 52 is connected, center conductor to center conductor, to a concentric line 58. The lines 58 and 60 are connected, center conductor to center conductor, to each other and to a concentric line 60, which as will be explained, is connected to an input of a balanced to unbalanced circuit or device, hereinafter balun, 62. The transposition 54 may be included in any one of the lines 42, 52, 56 and 58.

Since the anodes of the diodes 38 and 34 are connected in an identical manner to another input concentric line 62 by a means 64 which has an output connection 66 to the balun 62, no further description of the connection of the anodes of the diodes 34 and 38 to the input line 62 or to the output line 66 appears necessary. The lines so far described as being concentric lines may take the form of parallel conductors if so desired.

The balun 62 comprises a concentric conductor 68 having an internal conductor 70 and a conductive rod 72, whose size and shape have the same dimensions as the outside dimensions of the concentric conductor 68. The conductor 68 and the rod 72 are spaced from and extend parallel to each other and are fixed to a short-circuiting bar 74, the conductor 68 extending through the bar 74. The portion 76 of the conductor 68 that is beyond, that is to the left as shown in FIG. 2 of the bar 74, acts as the output of the described modulator. The end of the inner conductor 70 beyond the end of the concentric conductor 68 to the right is connected to the adjacent end of the rod 72. The inner conductors of the lines 60 and 66 are connected respectively to the rod 72 and to the outer conductor of the concentric line 68. As is known, push-pull or balanced waves applied to the balun 62 by the lines 60 and 66 appear at the concentric line portion 76 as single ended or unbalanced waves.

The length of the lines 42 and 52 from the connection to the input line 48 to their respective connections to the lines 56 and 58 are equal to each other and to a half a wavelength of the average of the output wave. The length of the lines 56 and 58 are equal to one-fourth the wavelength of the average input frequency. The input wave applied at the input concentric line 46 arrives at the anodes of the diodes 32 and 36 at 180° out of phase due to the transposition 54 in the line 52. The output of the bridge comprising the modulations produced in the bridge do not get to the input line 46 due to the fact that the path therefor by way of each of the lines 42 and 52 is one-half of a wavelength long. Due to the transposer 54, the modulated waves arriving at the lines 48 are 180° out of phase and cancel each other. However, paths of equal length are formed from the junction of the lines 42 and 52 to the lines 56 and 58, respectively, whereby the modulated waves add up in the line 60. The input wave from the concentric line 46 arrives at the junction of the lines 56 and 58, due to the transposer 54, at opposite phases, whereby they cancel each other in the line 60. Therefore, no modulation products arrive at the input line 46 and no input waves are applied to the line 60. In a similar manner, due to the operation of the circuit 64, no input products from the line 62 arrive at the line 66 and no modulation products arrive at the input line 62. Therefore, the two inputs 46 and 62 are separated from each other and from the output 76 and the output is separated from each of the inputs 46 and 62 whereby a fully doubly balanced modulator for high frequencies is provided. Since the circuits 40 to 58 and 64 operate as described for a wide band of frequencies, the described modulator is doubly balanced for a wide range of frequencies.

What is claimed is:

1. A high frequency doubly balanced wide band modulator operating in a high frequency band and having waves in two frequency bands applied thereto, including ring-connected diodes comprising at least four diodes connected anode to cathode to form a bridge having two pairs of opposite or conjugate terminals, a two-conductor line having four branches connected in series to form a ring, two of said branches being of the same length and being connected to an input connection, said two branches being longer than said other branches, the long branches being a quarter wavelength long at center of the output frequency band, the short branches being a quarter wavelength long at the average of the two input frequency bands, there being a transposition in one of said long branches, a connection from the junction of said long and said short branches to opposite terminals of said bridge, a second two-conductor line having four branches connected in series to form a second ring, two of the branches of said second ring being equal in length and being connected to a second input connection, and being of the same length as said other long branches, the remaining two branches of said second ring being equal in length to said other short branches, there being a transposition in one of the long branches of said second ring, a connection from each of the longer branches of said second ring to a respective opposite conjugate terminals of said bridge, a high frequency balanced to unbalanced device having two input connections and an output connection and, a connection from the junction of the short branches of said rings to respective input circuits of said balanced to unbalanced device.

2. The invention of claim 1 in which each branch of each of said rings comprises a concentric line.

3. The invention of claim 1 in which said balanced to unbalanced device comprises a concentric line and a rod arranged parallelly, there being an electrical connection between one end of said rod and a point on the outer conductor of said concentric line, the inner conductor of said concentric line being connected to the other end of said rod and said junction of said short branches of said two rings being connected respectively to the said other end of said rod and to the outer conductor of said concentric line.

* * * * *